United States Patent [19]

Babcock

[11] Patent Number: 4,550,287

[45] Date of Patent: Oct. 29, 1985

[54] DATA BUS TEST INSTRUMENT HAVING A TRI-COLORED LED AND INDICATING CONTINUITY, VOLTAGE AND POLARITY

[75] Inventor: Daniel L. Babcock, Bellevue, Wash.

[73] Assignee: The Boeing Company, Seattle, Wash.

[21] Appl. No.: 522,856

[22] Filed: Aug. 11, 1983

[51] Int. Cl.$^4$ .................. G01R 19/14; G01R 19/145; G01R 31/02; G01R 15/12

[52] U.S. Cl. .................... 324/73 R; 324/51; 324/133

[58] Field of Search .................. 324/51, 96, 122, 133, 324/149, 73 R

[56] References Cited

U.S. PATENT DOCUMENTS

| | | | |
|---|---|---|---|
| 3,813,664 | 5/1974 | Geyer | 340/248 |
| 3,836,844 | 9/1974 | Prugh | 324/51 |
| 3,838,339 | 9/1974 | Brandt | 324/133 |
| 3,870,950 | 3/1975 | Laass | 324/133 X |
| 3,964,039 | 6/1976 | Craford et al. | 340/248 |
| 3,970,933 | 7/1976 | Hamaguchi et al. | 324/133 |
| 4,005,365 | 1/1977 | Berger et al. | 324/133 |
| 4,044,304 | 8/1977 | Hamaguchi et al. | 324/133 |
| 4,091,292 | 5/1978 | Sibley | 307/130 |
| 4,139,820 | 2/1970 | Rode | 324/133 |
| 4,189,673 | 2/1980 | Shintaku | 324/133 |
| 4,207,517 | 6/1980 | Bloxam | 324/51 |
| 4,209,671 | 6/1980 | Charles et al. | 179/175 |
| 4,210,862 | 6/1980 | Koslar | 324/51 |
| 4,214,200 | 6/1980 | Hollander | 324/122 |
| 4,225,817 | 9/1980 | Kahlden | 324/133 |
| 4,272,142 | 6/1981 | Zapf | 339/29 |
| 4,366,434 | 12/1982 | Ellis | 324/133 X |
| 4,388,589 | 6/1983 | Molldrem | 324/133 X |

FOREIGN PATENT DOCUMENTS 1437098 5/1976 United Kingdom .

OTHER PUBLICATIONS

R. Turner, "Single LED Can Indicate Four Logic States", Electronic Engineering, vol. 49, No. 597, Oct. 1977, p. 23.
Sudarshan Sarpangal, "Team Up A Dual-LED And A Dual-Timer To Get The Logic States Of Two Binary Lines", Electronic Design 23, Nov. 8, 1978, p. 138.
Gordon W. Martin, "Versatile Logic Probe Displays Four Modes", Electronics, Nov. 25, 1976, pp. 130-131.
Brian Hewart, "Byte Basher's Life Saver", Personal Computer World, vol. 1, No. 8, Dec. 1978, pp. 24-25.
R. A. Rasmussen, "Three-State Bus Driver Test Methodology", IBM Technical Disclosure Bulletin, vol. 22, No. 10, Mar. 1980, pp. 4540-4542.

Primary Examiner—Gerard R. Strecker
Attorney, Agent, or Firm—Delbert J. Barnard

[57] ABSTRACT

A hand-held instrument for testing wire circuits. A tricolor light emitting diode is utilized to indicate the existence of a signal in a data bus. The diode displays different light signals to indicate the presence of either alternating or direct current, the polarity of a direct current, and continuity in a circuit. Voltage in the circuit is indicated by a variation in glow intensity of an incandescent lamp. The instrument is adapted for servicing and troubleshooting circuitry on board commercial aircraft, including both data bus circuits and other alternating and direct current circuits.

5 Claims, 2 Drawing Figures

DATA BUS TEST INSTRUMENT HAVING A TRI-COLORED LED AND INDICATING CONTINUITY, VOLTAGE AND POLARITY

DESCRIPTION

1. Technical Field

The present invention relates to the provision of a test device or instrument for use in troubleshooting electric circuits, and in particular data bus circuits aboard aircraft, which is safer, easier and quicker to use, and more portable and less expensive than other known equipment for performing the same function.

2. Background Art

The troubleshooting of problems associated with data bus wiring aboard aircraft require the use of some sort of instrument for (1) indicating the presence of data bus signals, (2) indicating whether or not a given data bus is a low speed or a high speed data bus, (3) checking continuity for open or short circuits, (4) indicating and distinguishing the presence of other common aircraft wiring voltages, such as 5 VAC, 5 to 15 VDC, 26 VAC, 28 VDC, and 115 VAC and (5) determining the polarity of the DC voltages.

Many instruments exist which are capable of performing one or more of these functions. However, there is no known test instrument which is capable of performing all of these functions in a quick and safe manner, and which is quite small in size and thus very portable, and which is inexpensive.

Generally speaking, commercial aircraft have standardized electrical circuits with certain voltages that are common to all the circuits. For example, typical voltages presently in use are 5 VAC (volts alternating current), 5–15 VDC (volts direct current) 26 VAC, 28 VDC, and 115 VAC. Some of the circuits are data buses, which are wire circuits that transmit electrical signals between aircraft electronic components. Data bus signals are direct current pulsations that are in the form of an electrical square wave having positive and negative polarity.

A technician servicing and troubleshooting aircraft circuits has to make a number of checks. For example, he identifies and distinguishes circuits by checking voltage. If an electric current is present in a circuit, it must be identified as being either alternating or direct. Direct current circuits have either positive or negative polarity which may also have to be identified. Circuits that are not functioning correctly may have to be tested for electrical continuity. In addition, circuits that are data buses must be checked to determine if they are transmitting signals properly.

Prior to this invention, it was not possible for a technician to perform all of these checks with one simple device. Simple hand-held probes are available for checking voltage and continuity. However, in the past, in order to check data bus circuits, a technician had to employ an expensive and complex data bus analyzer, such as the Model 429 data bus analyzer, manufactured by Aircraft Radio Incorporated. This resulted in an inefficient use of the technician's time. The technician would use a hand-held probe for checking voltage and continuity in data bus circuits, but then in order to check if the circuit was transmitting a signal, the technician would have to disconnect the probe and reconnect a data bus analyzer. The present invention eliminates this two step process and thereby saves the technician valuable time.

An advantage to the present invention is that it enables the technician to troubleshoot essentially all of the standard electrical circuits on board on aircraft with one portable, hand-held device. The invention permits the technician to check voltage and continuity of either alternating or direct current circuits. If checking a direct current circuit, the invention indicates electrical polarity. Additionally, if checking a data bus circuit, the invention permits the technician to ascertain whether or not the data bus is transmitting a signal.

Another advantage to the invention is that it eliminates the need for a technician to use a data bus analyzer in order to determine if a data bus is transmitting a signal. Typically, data bus analyzers have the capability to both indicate if a data bus is sending a signal, and to analyze the information being sent. In most cases, the technician has no need to analyze the substance of the signal. He is only interested in determining if a signal is present. The invention fulfills this need and in many cases totally eliminates the necessity for a data bus analyzer.

Another advantage to the invention is that it provides a safe means for checking aircraft circuits. Many aircraft circuits have electronic components that are easily damaged if a high voltage is inadvertently applied to the circuit. This invention is driven by a low voltage battery that doesn't have sufficient power to damage electronic components.

A further advantage to the invention is that it cannot be damaged when inadvertently connected to high voltage circuits.

Examples of test instruments and systems present in the patent and other literature are disclosed by the following United States and foreign patents and publications:

U.S. Pat. Nos.: 3,813,664, Geyer; 3,836,844, Prugh; 3,838,339, Brandt; 3,964,039, Craford et al; 3,970,933, Hamaguchi et al; 4,005,365, Berger et al; 4,044,304, Hamaguchi et al; 4,091,292, Sibley; 4,139,820, Rode; 4,189,673, Shintaku; 4,207,517, Bloxam; 4,209,671, Charles et al; 4,210,862, Koslar; 4,214,200, Hollander; 4,225,817, Kahlden; 4,272,142, Zapf; British Pat. No.: 1,437,098, Published 5/25/76.

PUBLICATIONS

1. R. Turner, "Single LED Can Indicate Four Logic States", ELECTRONIC ENGINEERING, Vol. 49, No. 597, October 1977, P. 23;

2. Sudarshan Sarpangal, "Team Up A Dual-LED And A Dual-Timer To Get The Logic States Of Two Binary Lines", ELECTRONIC DESIGN 23, Nov. 8, 1978, P. 138.

3. Gordon W. Martin, "Versatile Logic Probe Displays Four Modes", ELECTRONICS, Nov. 25, 1976, pp. 130-131;

4. Brian Hewart, "Byte Basher's Life Saver", PERSONAL COMPUTER WORLD, Vol. 1, No. 8, December 1978, pp. 24–25;

5. R. A. Rasmussen, "Three-State Bus Driver Test Methodology", IBM TECHNICAL DISCLOSURE BULLETIN, Vol. 22, No. 10, March 1980, pp. 4540–4542.

DESCRIPTION OF THE DRAWINGS

The present invention may be better understood by reading the description of the preferred embodiment taken in conjunction with the drawing, where.

DISCLOSURE OF THE INVENTION

Figure 1:
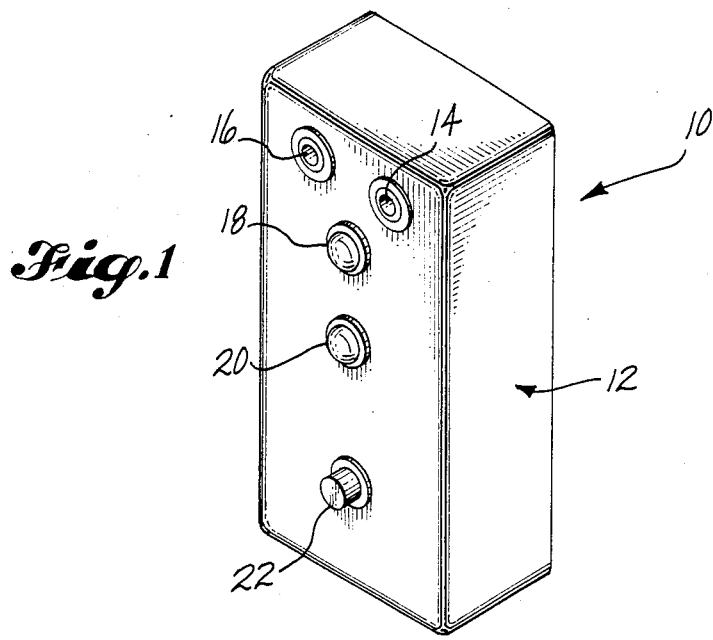
FIG. 1 is a perspective view of the embodiment, looking towards a display face.

In general, this invention relates to a simple instrument for testing wire circuits. The invention has first and second terminals enabling connection of the invention to an electrical circuit for testing. Circuitry means is connected to the terminals which includes a tricolor light emitting diode (LED) serially connected to lamp means. The tricolor LED is comprised of first and second light emitting diodes arranged together such that any one of three colors will be emitted depending on the electrical characteristics of the test circuit. The first diode displays a first color in response to a current flowing through it. Similarly, a current flowing through the second diode causes it to display a second color. The two diodes are arranged together such that when they are both operating at substantially the same time, the first color mixes with the second to form a third color.

The tricolor LED is operable in response to a positive DC voltage in the test circuit such that a current is admitted solely through the first diode, thereby causing it to emit a steady glow and display the first color. The LED responds to a negative DC voltage by admitting current solely through the second diode, causing it to glow and display the second color. If the invention is connected to a test circuit having either an alterating current or a data bus signal, both diodes operate in response by each admitting current, and emitting the first and second colors, respectively, such that the third color is displayed. The circuitry means enables data bus signals to cause the LED to display the third color in a flickering mode, the flickering corresponding to the frequency of the signal.

The lamp means enables the invention to indicate test circuit voltage. Included as a part of the lamp means is a display lamp, controllable according to the voltage of the test circuit. For example, the display lamp is off for certain test circuit voltage conditions, and glows either dimly or brightly in response to other voltage conditions. The preferred embodiment of the invention contemplates a display lamp composed of a plurality of incandescent lamps connected together in series.

The lamp means further includes resistance means which acts as an electrical ballast for protecting the invention from damage in the event of inadvertent connection of the invention to a high voltage test circuit. The preferred embodiment of the invention contemplates having the resistance means incorporated in the display lamp.

An aspect of the invention is the provision of continuity testing circuit means that operates in response to a test circuit either being open or having an electrical short. When the test circuit is open, the continuity testing circuitry means enables an electric current to be admitted through the first light emitting diode only, causing that diode to glow steady and display the first color. When there is an electrical short in the test circuit, the continuity testing circuitry means admits current solely through the second light emitting diode, thereby causing it to glow steady and display the second color.

The continuity testing circuitry means includes a battery and a switching device serially connected thereto for supplying an electric current to the first diode when the test circuit is open, and to the second diode when there is a short circuit in the test circuit. Current is transmitted from the battery to the first and second diodes by first and second unidirectional conductors. The first and second diodes are arranged together in a leg of the circuitry means. This leg couples one end of the first conductor to one end of the second so that current can be transmitted from either conductor into the leg. The other ends of the conductors are coupled together at a junction for receiving current from the battery when the switching device is closed. Having such an arrangement enables the continuity testing means to be operable so as to permit current flow through either light emitting diode when the testing means is being used to determine whether a short circuit or open circuit exists in the test circuit.

Each unidirectional conductor has a resistance means. The resistance means of the second conductor is substantially less than that for the first conductor. The second conductor also has a maximum current transmitting capacity which is greater than the maximum current transmitting capacity of the first. The greater current carrying capacity of the second conductor protects the invention from damage in the event that the switching device is accidentally closed when the invention is connected to a high voltage test circuit.

These and other aspects of the invention will become apparent when the description of the invention is read in conjunction with the drawings.

DESCRIPTION OF THE PREFERRED EMBODIMENT

Referring now to the drawings, the invention is designated generally as 10 in FIG. 1. The invention is contained within a housing 12, the housing being sized so that it can easily be hand-held by a user of the invention. Banana jacks 14 and 16 are externally located on one side of the housing. These jacks provide a means for connecting the invention to an electrical circuit for troubleshooting the circuit. The connection is made by plugging electrical conductors (not shown in the figure) which are connected to the circuit into jacks 14 and 16. Housing 12 is further provided with a pair of apertures 18 and 20 through which voltage indicating incandescent lamps and a light emitting diode are visible. FIG. 1 also shows a button 22 protruding from housing 12 which, when depressed, enables the invention to be used for testing electrical continuity in a circuit. The electrical circuitry of the invention will now be discussed, followed by a discussion of the operation of the invention.

Figure 2:
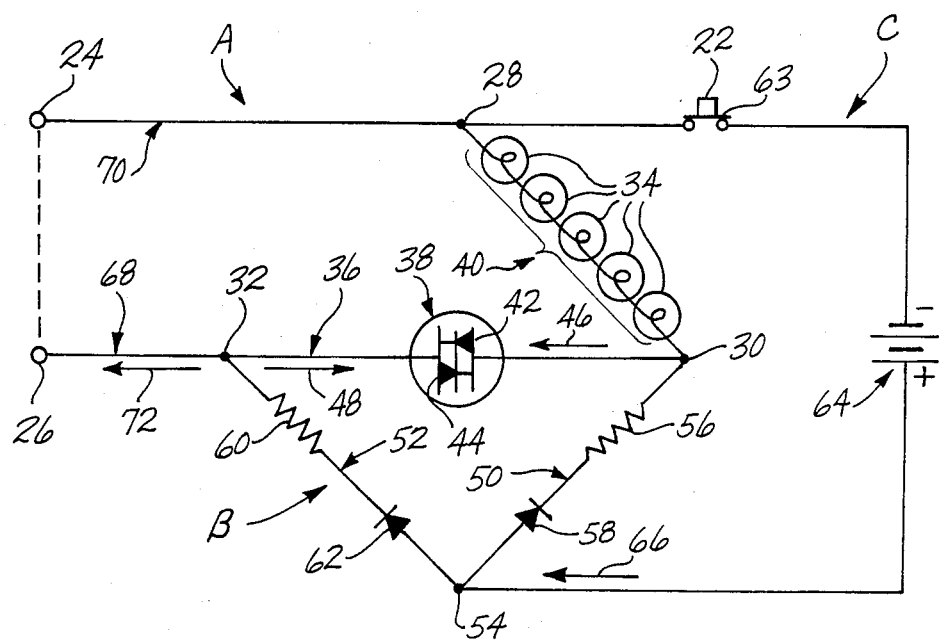
FIG. 2 is a schematic diagram of the basic circuitry portion of the embodiment.

A circuitry scheme, which composes the essence of this invention, is shown in FIG. 2. The terminals 24 and 26 are electrically connected to banana jacks 14 and 16, respectively. An electrical circuit, indicated generally as A, is connected to terminals 24 and 26. Circuit A has three junctions 28, 30 and 32 serially connecting a conductor 70, a ballast leg 40, another leg 36, and a second conductor 68.

Connected between junctions 28 and 30 is ballast leg 40 which has five incandescent lamps 34 serially connected to each other. These lamps are typically 28 volt lamps with a current carrying capacity of 40 milli-amps. The lamps serve a dual function. First, as will be explained later when the operation of the invention is described, their illumination or glow intensity indicates voltage of a particular electrical circuit being tested. Second, the series connection of the lamps places a high resistance between junctions 28 and 30 which serves to act as an electrical ballast. In addition to having importance in relation to invention operation, ballast leg 40 protects the invention from damage in the event of inadvertent connection to a high voltage circuit by the user. Although FIG. 2 shows a series of five lamps connected together in series, the same illumination and ballast function can be achieved by replacing the five 28 volt lamps with other lamps having different voltages.

Junctions 30 and 32 are connected by leg 36 which has a tricolor light emitting diode 38. This diode 38 is serially connected as a part of leg 36 so that any current passing through the leg will also pass through the diode. The tricolor diode 38 includes two light emitting diodes 42 and 44 electrically connected in parallel and physically located adjacent each other. These two diodes 42, 44 are essentially unidirectional conductors and permit current flow in one direction only. Although they are connected in parallel, they are biased for conducting current in opposite directions. Diode 42 permits current to be conducted in a direction indicated by arrow 46. Alternatively, diode 44 conducts current only in the direction indicated by arrow 48. When an electric current passes through diode 42, a red light is emitted. Current passing through diode 44 causes a green light to be emitted. Therefore, a direct current passing through circuit A will cause either diode 42 or 44 to emit a green or red light depending on the direction of the current.

If an alternating current is transmitted through circuit A, both diodes 42 and 44 will emit light. Since they are physically located adjacent each other, the red light emitted by diode 42 mixes with the green light emitted by diode 44 to generate a yellow light. This is because an alternating current is essentially an electrical sinusoidal wave. The current alternates its direction through leg 36 according to the frequency of the wave. As an illustration, when the sinusoidal wave has a positive value, the current in leg 36 travels in the direction of arrow 46. When the sinusoidal wave has a negative value, the current in leg 36 travels in the direction of arrow 48. Therefore, for the positive half of every alternating current cycle, diode 42 will emit a red light; and for the negative half of every cycle, diode 44 will emit a green light. If the current had a low frequency, the diodes would appear to pulsate alternately. But since most alternating currents have a high frequency, no such pulsation would be noticeable to a naked eye and diodes 42 and 44 would appear to emit a constant red and green light, respectively. In the tricolor light emitting diode 38, the diodes 42 and 44 are connected physically close to each other such that red light emitted by diode 42 mixes with green light emitted by diode 44. This mixing of primary colors generates an amber or yellow light. As a result, any time the invention is connected to a circuit having an alternating current, the tricolor light emitting diode 38 emits a yellow light.

In addition, many of the 5 to 15 VDC circuits aboard an aircraft are data buses. A data bus is a circuit that transmits electric signals between aircraft electronic components. The signals are pulsated direct currents which are in the form of an electrical "square" wave having alternating positive and negative polarity. Such a square wave causes the tricolor diode 38 to emit a yellow light in the same manner as that which was described for an alternating current. But the yellow light flickers correspondingly with the pulsations of the current in the data bus. Although the invention does not enable the technician to analyze the information transmitted by a data bus, the flickering yellow light emitted by diode 38 does indicate to him that the data bus is transmitting a signal properly. Furthermore, a high or low speed flicker enables the technician to distinguish between high and low speed data buses.

Connected to circuit A is another circuit B having two unidirectional conductors 50 and 52. Conductors 50 and 52 are each connected at one end to junctions 30 and 32, respectively. The other ends of the conductors are connected together at junction 54. Conductor 50 is composed of a resistor 56 serially connected to a diode 58. The diode 58 permits current to be transmitted only in a direction from junction 54 to junction 30. Similarly, conductor 52 has a resistor 60 serially connected to a diode 62. The diode 62 permits current to be transmitted only in a direction from junction 54 to junction 32. Resistor 60 is typically selected to have a 300 ohm resistance with a maximum power carrying capacity of 5 watts. Resistor 56 is selected to have a resistance of 1000 ohms and a maximum carrying capacity of 0.5 watts. The diodes 58 and 62 are typically General Electric diodes identified by specification part No. 2N4002.

A third circuit C is connected to circuit A at junction 28 and to circuit B at junction 54. Circuit C has a switch 63 which includes button 22. Switch 63 is serially connected to a 9 volt battery 64.

With the circuitry of FIG. 2 thus described, the operation of the invention will now be explained in the context of a technician troubleshooting or testing an aircraft circuit. The technician begins by connecting the invention to a particular circuit. As was mentioned in the background art portion of this application, aircraft circuits have voltages that are common to many aircraft. These voltages are typically 5 VAC (volts alternating current), 5 to 15 VDC (volts direct current), 26 VAC, 28 VDC, or 115 VAC. If a current is present in the circuit being tested, it will flow through circuit A, and, for certain voltages in the circuit, illuminate lamps 34 in ballast leg 40. The lamps 34 glow brightly if the circuit has 115 VAC, dimly for either 26 VAC or 28 VDC, and are extinguished for the lower voltages. The technician "reads" the voltage by viewing lamps 34 through aperture 18. The lamps glow irrespective of whether the current is direct or alternating.

Alternating and directs currents, and the data bus signals, can be distinguished by observing the tri-color light emitting diode 38 through aperture 20. The diode 38 will emit a yellow light for an alternating current, and a flickering yellow light for a data bus signal passing through circuit A. If either a red or a green light is observed, then the invention is connected to a circuit having a direct current. A red light indicates that terminal 24 is connected to the positive potential of a direct current circuit with the current flowing through circuit A in the direction of arrow 46. Current flowing in this direction passes through diode 42 thus causing it to emit a red light. On the other hand, a green light indicates that terminal 24 is connected to the negative potential of a direct current circuit. If this is the case, current flows through circuit A in the direction of arrow 48, and passes through diode 44 causing it to emit a green light.

Whenever the invention is used for troubleshooting active electrical circuits, i.e. circuits wherein an AC, DC, or data bus signal is present, the current flow is limited to circuit A only. This is because, first, button 22 has not been depressed which means switch 63 is open. Therefore, current is prvented from being transmitted through circuit C. Second, diodes 58 and 62 in circuit B are biased against enabling current to flow from either junction 30 or 32 to junction 54.

Circuits B and C are employed when the invention is used to test electrical continuity in a circuit. Such a circuit is in an inactive, non-operative condition, i.e. no current is present in the circuit. To test continuity, the user of the invention depresses button 22 of switch 63. This causes battery 64 to send a direct current out of circuit C into circuits B and A. The current from battery 64 flows in the direction indicated by arrow 66 and branches at junction 54. Part of the current is transmitted through conductor 52 to junction 32. Another part is transmitted through conductor 50 to junction 30. If the test circuit is open, leg 68 in circuit A will not provide an electrically conductive path for the current in conductor 52. Therefore, this current must travel through leg 36 in the direction indicated by arrow 48 where it rejoins the current from conductor 50 at junction 30. Diode 42 is biased against permitting current to flow in this direction. However, diode 44 is biased oppositely to diode 42 and will transmit the current, thereby emitting a green light which indicates to the technician an absence of electrical shorts in the test circuit. At junction 30 the rejoined current continues through ballast leg 40 to junction 28. Since leg 70 in circuit A also does not provide a conductive path, the current must complete its travel through circuit C.

If the test circuit has an electrical short, then there will be an electrically conductive path joining terminal 26 to terminal 24 (as indicated by the dashed line in FIG. 2). This enables conductor 68 to transmit the current from conductor 52 onward in the direction indicated by arrow 72. In this situation, the current in conductor 50 will then travel through junction 30 and continue through leg 36 in the direction indicated by arrow 46. The current travels in this direction because the resistance of leg 36 is essentially negligible in comparison to the resistance of ballast leg 40. The current from conductor 50 then rejoins the current from conductor 52 at junction 32 where it continues through circuit A back into circuit C. Since a current is flowing through leg 36 in the direction of arrow 46, diode 42 emits a red light which indicates to the technician that an electrical short exists somewhere in the test circuit. As suggested earlier, the switch 63 and battery 64 in circuit C are used in combination with the unidirectional conductors 50 and 52 in circuit B solely for testing continuity in an electrical circuit. The switch 63 remains open when the invention is being used to determine voltage, polarity, and the existence of data signals in a circuit. If switch 63 is accidentally closed while the invention is connected to a high voltage test circuit, the higher current transmitting capacity of conductor 52 protects the conductor from damage.

The invention herein described and illustrated is a preferred embodiment. It is intended that the description and drawings shall be interpreted as illustrative and not in a limiting sense. The spirit and scope of the invention is to be limited only by such claims.

What is claimed is:

1. An instrument for testing an electrical circuit, said instrument indicating (1) the presence of data bus signals in a circuit, (2) whether such data bus signals are of a low speed or a high speed nature, (3) continuity of a circuit, (4) voltage in a circuit, and (5) the polarity of a DC voltage in a circuit, said instrument comprising:
   first (24) and second (26) terminals connectable to the electrical circuit to be tested;
   a first circuit leg (A) comprising a first junction (28), a second junction (30), and a third junction (32), wherein said first junction (28) is connected to one of said terminals, and wherein said third junction (32) is connected to the other of said terminals;
   ballast means (40) connecting said first (28) and second (30) junctions, said ballast means (40) including voltage indicator means for indicating the voltage of said circuit being tested;
   a tri-color LED (38) connected between said second (30) and third (32) junctions;
   a second circuit leg (B) connecting a fourth junction (54) to said first circuit leg (A), said second circuit leg (B) including a first unidirectional conductor (50) having a certain resistance and being connected between said fourth (54) and said second (30) junctions, said first conductor (50) permitting electrical current to flow only in a direction from said fourth junction (54) to said second junction (30), and a second unidirectional conductor (52) having a certain resistance and being connected between said fourth (54) and said third junction (32), said second conductor (52) being operable to permit electrical current to flow only in a direction from said fourth junction (54) to said third junction (32); and
   a third circuit leg (C) including a switch (22) and a battery (64), said switch (22) serially connecting said battery (64) to said first junction (28), and with said battery (64) also being connected to said fourth junction (54).

2. An instrument according to claim 1, wherein said ballast leg (40) comprises a plurality of lamps connected together in series between said first (28) and second (30) junctions.

3. An instrument according to claim 2, wherein said ballast leg (40) comprises five lamps (34) connected together in series, wherein each lamp has a voltage rating of 28 volts, and a current carrying capacity of 40 milli-amps.

4. An instrument according to claim 1, wherein said first unidirectional conductor (50) includes a resistor (56) serially connected to a diode (58), and wherein said second unidirectional conductor (52) includes a resistor (60) serially connected to a diode (62), and wherein the resistor (60) of said second unidirectional conductor (52) has a resistance that permits a relatively high electrical current to flow through said second unidirectional conductor (52) in comparison to the resistance of the resistor (56) in said first unidirectional conductor (50).

5. An instrument in accordance with claim 4, wherein the resistor (56) of said first unidirectional conductor (50) has a resistance of 1000 ohms and a maximum current carrying capacity of 0.5 watts, and wherein the resistor (60) of said second unidirectional conductor (52) has a resistance of 300 ohms and a maximum current carrying capacity of 5.0 watts.

* * * * *